United States Patent
Lu et al.

(10) Patent No.: US 10,439,667 B1
(45) Date of Patent: Oct. 8, 2019

(54) FABRIC CASES FOR ELECTRONIC DEVICES

(71) Applicant: Apple Inc., Cupertino, CA (US)

(72) Inventors: Jessica J. Lu, Mountain View, CA (US); Daniel A. Podhajny, San Jose, CA (US); Daniel D. Sunshine, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/056,309

(22) Filed: Aug. 6, 2018

Related U.S. Application Data

(60) Provisional application No. 62/551,177, filed on Aug. 28, 2017.

(51) Int. Cl.
| | |
|---|---|
| *H04M 1/00* | (2006.01) |
| *H04B 1/3888* | (2015.01) |
| *H05K 5/03* | (2006.01) |
| *H05K 5/02* | (2006.01) |
| *D03D 1/00* | (2006.01) |
| *A45C 11/00* | (2006.01) |

(52) U.S. Cl.
CPC ......... *H04B 1/3888* (2013.01); *H05K 5/0217* (2013.01); *H05K 5/03* (2013.01); *A45C 2011/002* (2013.01); *A45C 2011/003* (2013.01); *D03D 1/0035* (2013.01); *D10B 2101/06* (2013.01); *D10B 2101/08* (2013.01); *D10B 2101/20* (2013.01); *D10B 2403/03* (2013.01); *G06F 2200/1633* (2013.01)

(58) Field of Classification Search
CPC ...... H04B 1/3888; H05K 5/0217; H05K 5/03; A45C 2011/002; A45C 2011/003; D03D 1/0035; D10B 2101/06; D10B 2101/08; D10B 2101/20; D10B 2403/03; G06F 2200/1633
USPC ...................................... 455/575.1
See application file for complete search history.

(56) References Cited

U.S. PATENT DOCUMENTS

| | | | |
|---|---|---|---|
| 6,926,856 B2 * | 8/2005 | Hus ..................... | B29C 45/0046 264/257 |
| 8,545,966 B2 | 10/2013 | Vito et al. | |
| 9,124,680 B2 | 9/2015 | Lundell | |
| 2004/0237599 A1 * | 12/2004 | Kondou .................. | D04B 1/18 66/202 |

(Continued)

OTHER PUBLICATIONS

Podhajny et al., U.S. Appl. No. 14/861,625, filed Sep. 22, 2015.

*Primary Examiner* — Huy C Ho
(74) *Attorney, Agent, or Firm* — Treyz Law Group, P.C.; Kendall W. Abbasi

(57) ABSTRACT

A fabric case for an electronic device may include a back panel having a periphery and a sidewall that extends around the periphery. The back panel and the sidewall may be joined monolithically or may be joined using seams. A monolithic fabric case may be formed by knitting rows of loops to create a sidewall, knitting rows of loops to create a back panel, and joining the loops of the sidewall with the loops of the back panel as the back panel is being knitted. A fabric case with seams may be formed by attaching a fabric sidewall to a fabric back panel using a seam such as a chain stitch. The sidewall may be a seamless tube of fabric that extends continuously around the back panel. The seamless tube may be folded to create interior and exterior walls. A stiffener may be interposed between the interior and exterior walls.

20 Claims, 11 Drawing Sheets

(56) References Cited

U.S. PATENT DOCUMENTS

2012/0194982 A1    8/2012   Hishida
2013/0092562 A1    4/2013   Wyner
2015/0151515 A1    6/2015   Skepton

* cited by examiner

FABRIC CASES FOR ELECTRONIC DEVICES

This application claims the benefit of provisional patent application No. 62/551,177, filed Aug. 28, 2017, which is hereby incorporated by reference herein in its entirety.

BACKGROUND

This relates generally to fabric, and, more particularly, to forming fabric for structures such as cases for electronic devices.

Electronic devices such as cellular telephones, computers, and other electronic equipment are sometimes used in conjunction with external cases. A user may, for example, place an electronic device in a removable plastic case to protect the electronic device from scratches. Removable cases may also be used to personalize electronic devices.

Plastic cases may be satisfactory in certain situations, but some users may desire a case with different aesthetics. As a result, fabric cases have been developed.

There are challenges associated with forming fabric cases for electronic devices. If care is not taken, fabric cases may not wear well, may be bulky, or may have an undesirable appearance.

It would therefore be desirable to be able to provide improved removable cases for electronic devices.

SUMMARY

A fabric case for an electronic device may include a back panel having a periphery and a sidewall that extends around the periphery. The back panel and the sidewall may be joined monolithically or may be joined using seams.

A monolithic fabric case may be formed by knitting rows of loops to create a sidewall, knitting rows of loops to create a back panel. As the back panel is knitted, loops of the sidewall may be joined with loops of the back panel. This may include moving the sidewall loop from a first needle to a second needle so that the sidewall loop and the back panel loop are momentarily held on the same needle. This results in the sidewall loop and the back panel loop being captured together as the next row of the back panel is knitted. This process is repeated until all of the loops in the last row of the sidewall have been joined with the outer edge loops of the back panel.

A fabric case with seams may be formed by attaching a fabric sidewall to a fabric back panel using a seam such as a chain stitch. The chain stitch may capture a first end of the sidewall and a second end of the back panel. Both ends may face the exterior or interior of the fabric case, or one end may face the exterior and the other may face the interior.

The sidewall of a fabric case may be a seamless tube of fabric that extends continuously around the back panel. The seamless tube may be folded to create interior and exterior walls.

A stiffener may be interposed between the interior and exterior walls. The stiffener may be formed from plastic or other suitable material.

DETAILED DESCRIPTION

Electronic devices may be provided with cases such as fabric cases. The fabric cases may be removable external cases. When a user desires to protect an electronic device from scratches or other damage, the user may place an electronic device within a case. When the user wishes to use a different case to change the appearance of an electronic device, the electronic device may be transferred from one case to another. If desired, fabric may be incorporated into an electronic device housing or may be used in forming other fabric-based structures. Arrangements in which fabric is used in forming removable external cases are sometimes described herein as an example.

The fabric for a removable case may be woven, knitted (e.g., weft knitted or warp knitted), or braided, or may be formed using other strand intertwining techniques. For example, fabric can be knitted using a knitting machine.

Figure 1:
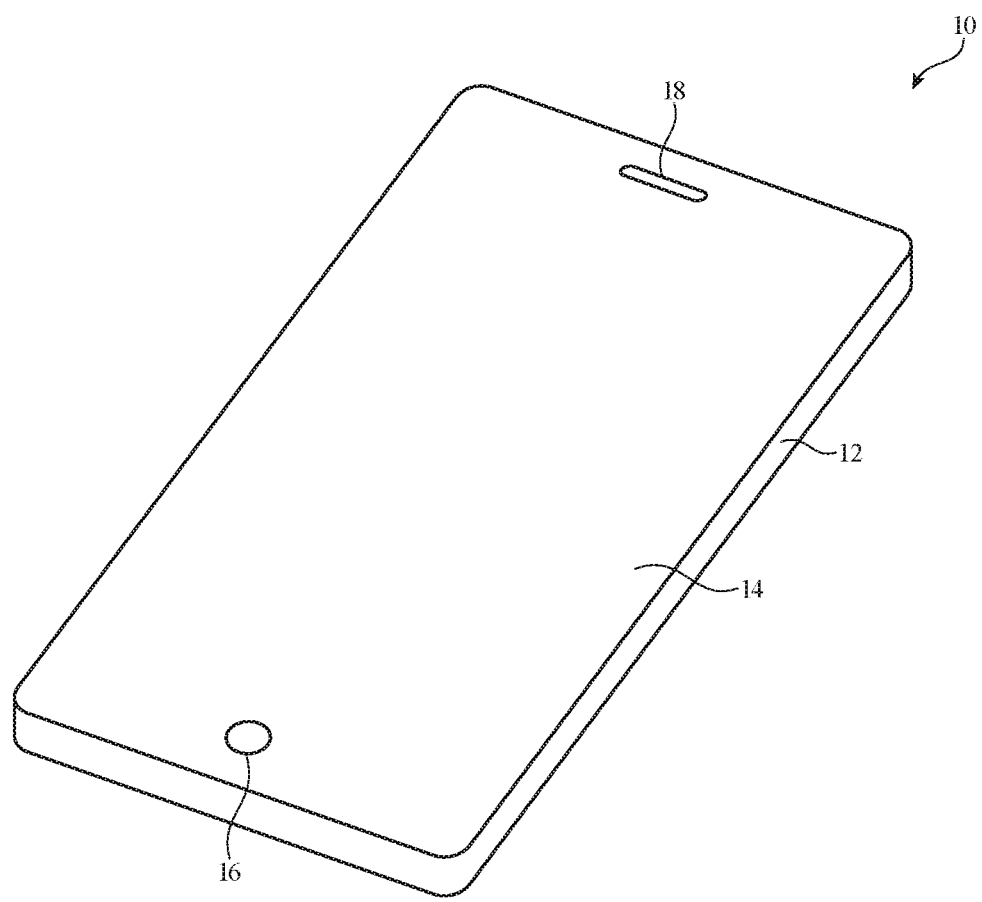
FIG. 1 is a perspective view of an illustrative electronic device in accordance with an embodiment.

An electronic device of the type that may be provided with a removable case that has been formed using intertwined strands is shown in FIG. 1. In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies.

Display 14 may be protected using a display cover layer such as a layer of transparent glass or clear plastic. The display cover layer may form a planar front face for device 10. The rear of housing 12 may have a parallel planar surface. Housing sidewalls may run around the periphery of housing 12. Device 10 may have a rectangular outline (e.g., a rectangular footprint when viewing the front face of the device) or may have other suitable footprints.

Openings may be formed in the display cover layer. For example, an opening may be formed in the display cover layer to accommodate a button such as button 16. An opening may also be formed in the display cover layer to accommodate ports such as speaker port 18. Openings may be formed in housing 12 to form communications ports (e.g., an audio jack port, a digital data port, etc.), to form openings for buttons, etc.

Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

Figure 2:
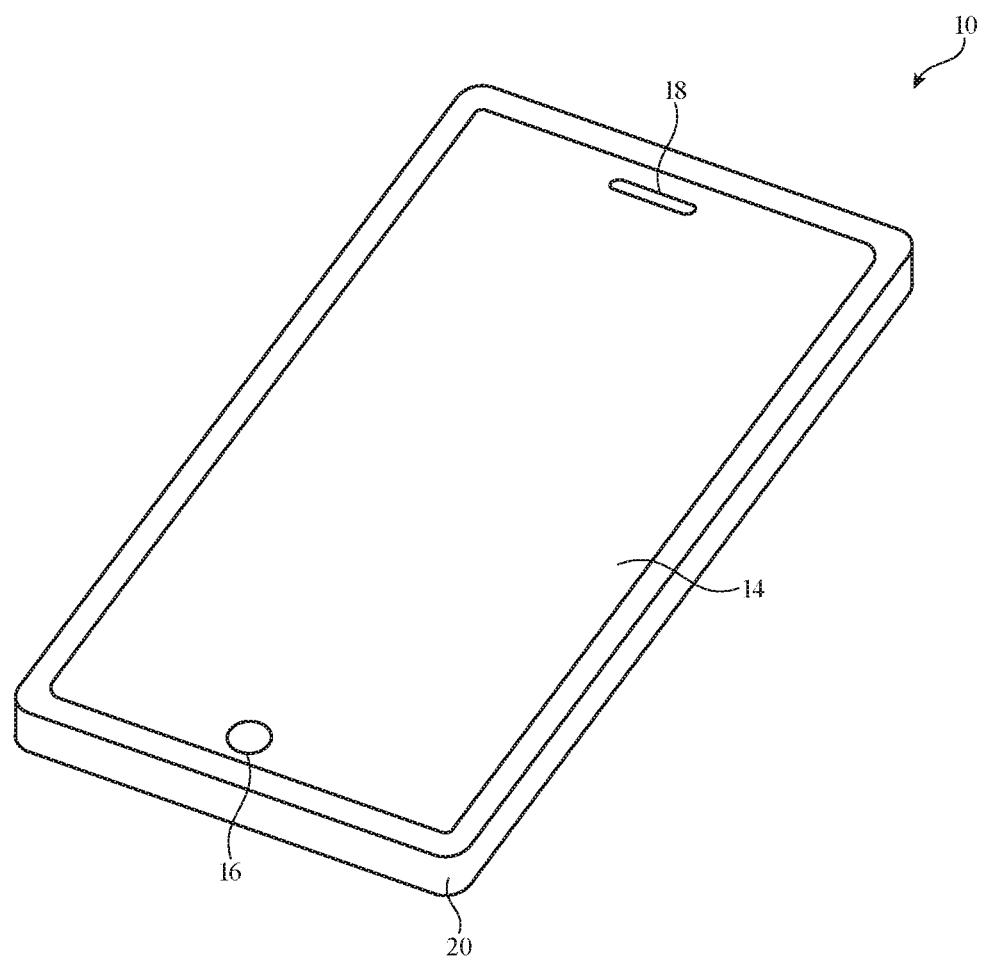
FIG. 2 is a perspective view of an illustrative electronic device to which a removable case has been attached in accordance with an embodiment.

FIG. 2 is a perspective view of device 10 of FIG. 1 in a configuration in which device 10 has been mounted in a removable case. As shown in FIG. 2, removable case 20 may have walls that run around the periphery of device 10. If desired, case 20 may form a cover with a hinged portion, a structure with a pocket into which device 10 may slide, or other enclosure that receives device 10. In the example of FIG. 2, case 20 surrounds device 10, but does not cover display 14. This type of arrangement, which may be desirable for devices such as cellular telephones, watches, and tablet computers, allows display 14 to be viewed by a user without opening a cover flap or moving any portion of case 20. If desired, however, case 20 may be provided with pockets, flaps, hinged portions, straps, and other structures. The configuration of FIG. 2 is merely illustrative.

Figure 3:
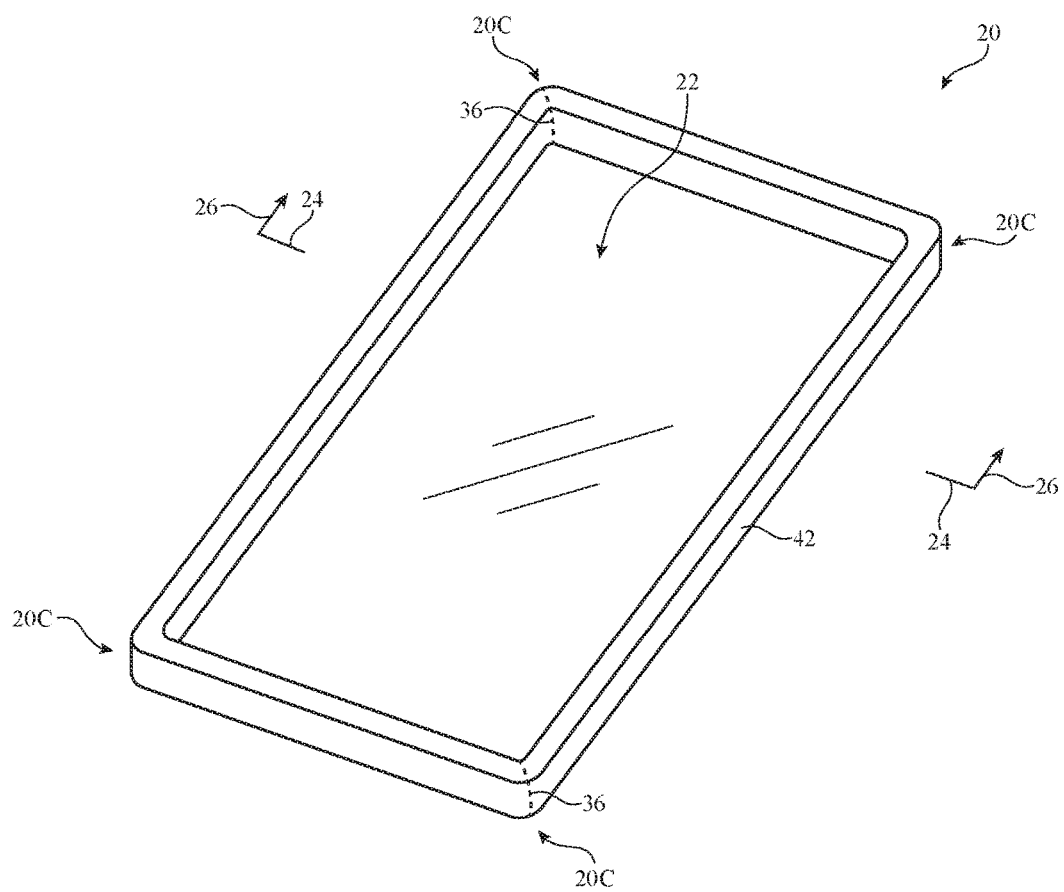
FIG. 3 is s perspective view of an illustrative removable electronic device case in accordance with an embodiment.

FIG. 3 is a perspective view of case 20 of FIG. 2 in a configuration in which device 10 is not present (i.e., a configuration in which case 20 has been removed from device 10). As shown in FIG. 3, case 20 may have four straight segments each of which runs along and covers a respective one of the four straight peripheral edges of the rectangular housing of device 10. Corner portions of the case join the straight segments together to form a case with a rectangular ring shape. Corners 20C may be rounded when viewed from above (i.e., when case 20 has a footprint with rounded corners) or may have other shapes. Central opening 22 may have a rectangular shape (e.g., a rectangular shape with rounded corners) or other shape suitable for receiving electronic device 10 when electronic device 10 is mounted within case 20.

Case 20 may have one or more portions formed from fabric 42. Fabric 42 may be soft (e.g., case 20 may have a fabric surface that yields to a light touch), may have a rigid feel (e.g., the surface of case 20 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

The strands of material in fabric 42 may be single-filament strands (sometimes referred to as fibers or monofilaments), may be yarns or other strands that have been formed by intertwining multiple filaments (multiple monofilaments) of material together, or may be other types of strands (e.g., tubing). Monofilaments for fabric 42 may include polymer monofilaments and/or other insulating monofilaments and/or may include bare wires and/or insulated wires. Monofilaments formed from polymer cores with metal coatings and monofilaments formed from three or more layers (cores, intermediate layers, and one or more outer layers each of which may be insulating and/or conductive) may also be used.

Yarns in fabric 42 may be formed from polymer, metal, glass, graphite, ceramic, natural materials as cotton or bamboo, or other organic and/or inorganic materials and combinations of these materials. Conductive coatings such as metal coatings may be formed on non-conductive material. For example, plastic yarns and monofilaments in fabric 42 may be coated with metal to make them conductive. Reflective coatings such as metal coatings may be applied to make yarns and monofilaments reflective. Yarns may be formed from a bundle of bare metal wires or metal wire intertwined with insulating monofilaments (as examples).

Strands of material may be intertwined to form fabric 42 using intertwining equipment such as weaving equipment, knitting equipment, or braiding equipment. Intertwined strands may, for example, form woven fabric, knit fabric, braided fabric, etc.

Figure 4:
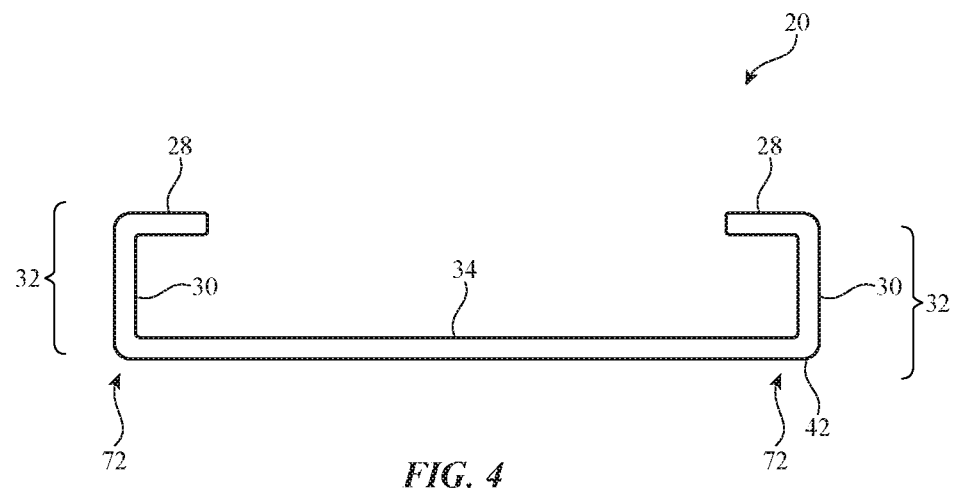
FIG. 4 is a cross-sectional view of a removable case with peripheral walls monolithically formed with a back panel in accordance with an embodiment.

A cross-sectional view of case 20 of FIG. 3 taken along line 24 and viewed in direction 26 is shown in FIG. 4. As shown in FIG. 4, case 20 may have peripheral portions such as peripheral wall portions 32 and a rear wall portion such as back panel 34. Back panel 34 may cover the rear side of electronic device 10 when device 10 is within case 20. Peripheral walls 32 may include vertical sidewalls 30 that join respective upper horizontal wall portion 28. Peripheral walls 32 may extend around the periphery of device 10 when device 10 is installed within case 20. The cross-sectional shape of case 20 of FIG. 4 (i.e., the shape in which horizontal walls 28 are perpendicular to vertical walls 30) is merely illustrative. If, for example, device 10 has edges with a curved cross-sectional shape, the profile of peripheral walls 32 may have a corresponding curved shape (e.g., sidewall 30 may bow outwards). In some arrangements, horizontal portion 28 of walls 32 may be omitted. If desired, the fabric of case 20 may be formed from strands that are elastic to accommodate and/or conform to devices 10 with a variety of different edge profiles and footprints. The example of FIGS. 3 and 4 is merely illustrative.

If desired, horizontal portion 28 (sometimes referred to as a lip) may include a cord that runs completely or partially around the perimeter of case 20. The cord may be located on the exterior of case 20 or may be located within case 20 (e.g., may be covered by fabric).

Back panel portion 34 may be formed from a layer of plastic or metal or may be formed from a layer of fabric. Rear portion 34 may cover some or all of the rear of device 10 and may be attached to portions 32 or woven or formed as an integral portion of portions 32. In the example of FIG. 4, peripheral walls 32 and back panel 34 are formed from fabrics that are joined monolithically (e.g., without joints or seams). A monolithic case of the type shown in FIG. 4 may be formed by gradually joining loops of the peripheral wall fabric with loops of the back panel fabric as the back panel fabric is knitted. This process is described in greater detail in connection with FIGS. 7-10.

Figure 5:
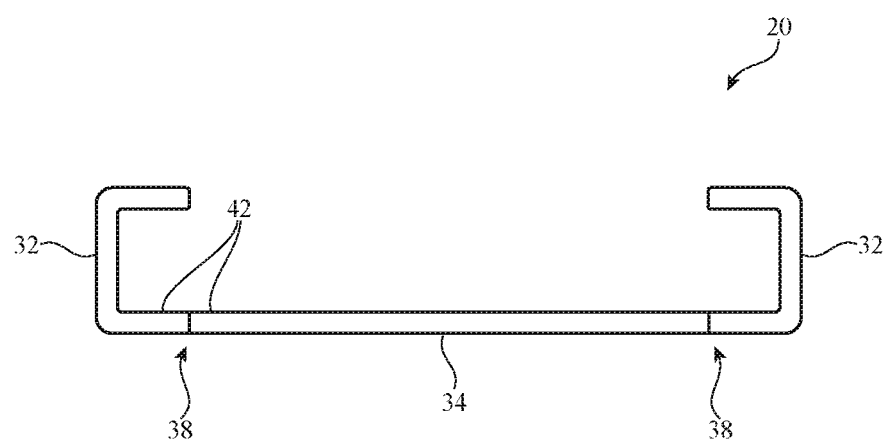
FIG. 5 is a cross-sectional view of a removable case with peripheral walls that are attached to a back panel with seams in accordance with an embodiment.

FIG. 5 is a cross-sectional side view of an illustrative case 20 in which peripheral walls 32 and back panel 34 are formed from fabrics that are joined using seams such as seam 38. Seam 38 may be a chain stitch formed using a linking strand, or may be any other suitable type of stitch, seam, or attachment member. When peripheral walls 32 and back panel 34 are formed separately and then subsequently joined, different methods and techniques may be employed in the formation of each piece, if desired. For example, peripheral walls 32 may be flat knit single layer structure, a warp knit fabric, a weft knit fabric, a seamless tube of fabric, one or more strips of fabric that are joined to form a rectangular outline, a spacer fabric, or other suitable fabric type. Back panel 34 may be a flat knit structure, a warp knit structure, a weft knit structure, a spacer fabric, one or more strips of fabric that are joined to form a panel, or other suitable fabric type. Examples involving non-monolithic fabric cases of the type shown in FIG. 5 are discussed in connection with FIGS. 11-19.

Figure 6:
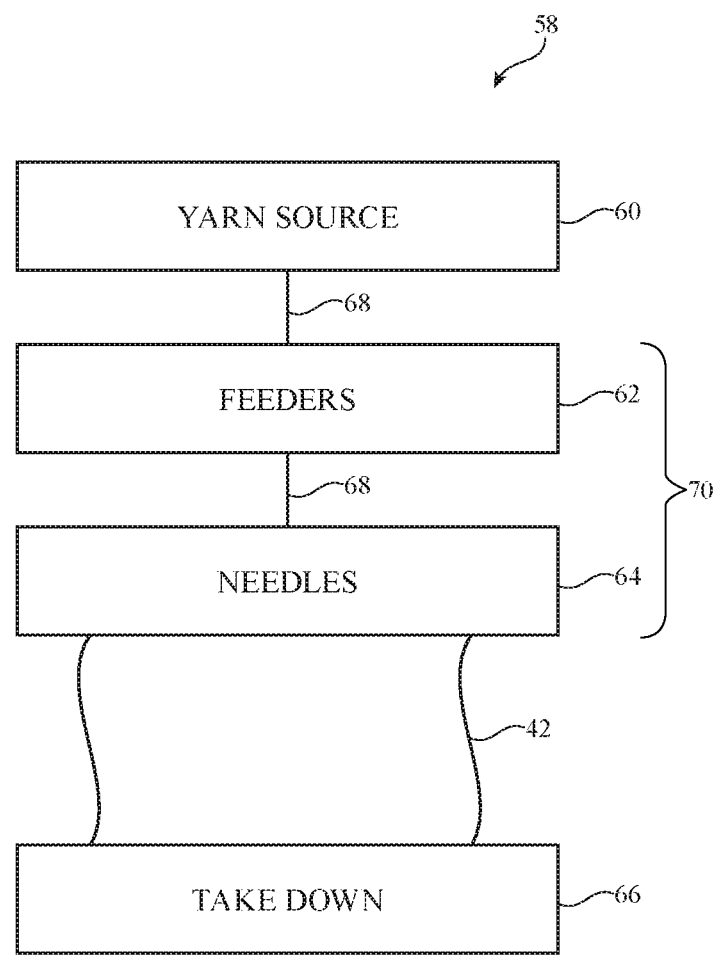
FIG. 6 is a diagram of an illustrative knitting system in accordance with an embodiment.

Knitted fabric such as knitted fabric 42 of FIGS. 3, 4, and 5 may be formed using any suitable knitting equipment. An illustrative knitting system for forming fabric 42 is shown in FIG. 6. As shown in FIG. 6, knitting equipment such as knitting system 58 may include a yarn source such as yarn source 60. Yarn source 60 may include a creel with spools of yarn 68. Knitting elements 70 may be used to knit yarn 68 into knitted fabric 42. Knitted fabric 42 may be gathered on drums or other take-down equipment 66.

Knitting elements 70 may include yarn guide structures such as feeders 62 that guide yarn 68 towards needles and other equipment 64. Equipment 64 may include latch needles or needles of other types. In some arrangements, equipment 64 may include multiple beds of needles such as a front needle bed and a back needle bed. Equipment 64 may include yarn positioning structures that move yarn 68 from one bed to another bed. Equipment 64 may also include hooks or other cam structures and other structures for manipulating the positions of needles. The needles, feeders, and other knitting elements 70 may be implemented as separately adjustable components or the functionality of two or more of these tools may be combined in equipment 64. Equipment such as feeders 62 and needles 64 (i.e., knitting elements 70) may sometimes be referred to as knitting equipment.

The use of a knitting system such as knitting system 58 of FIG. 6 to knit fabric 42 is sometimes described herein as an illustrative example. Other techniques for forming fabric 42 may be used, if desired.

Figure 7:
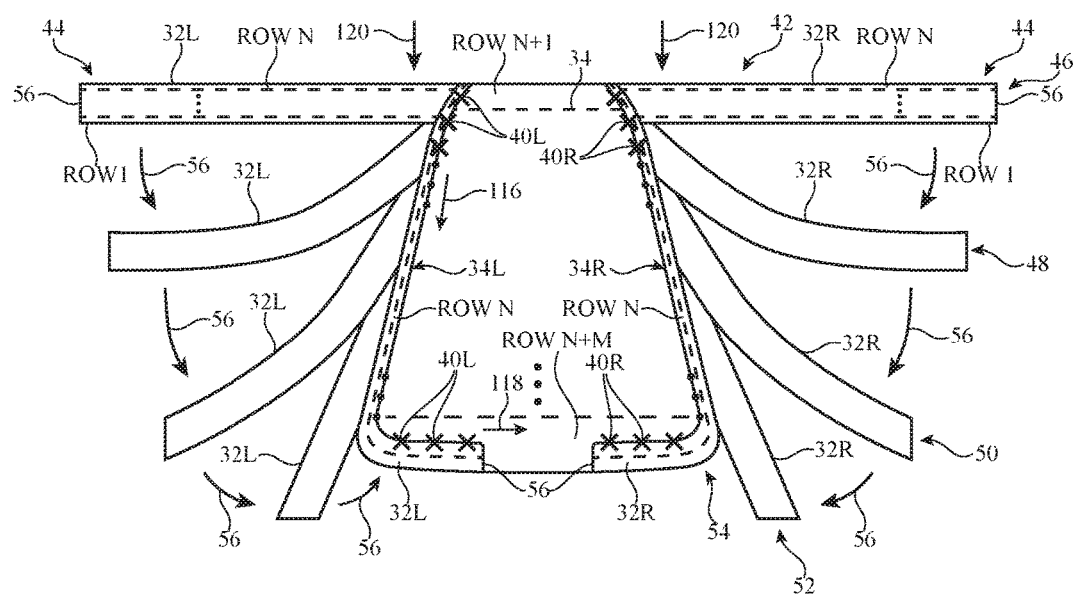
FIG. 7 is a diagram showing how peripheral walls of a case may be monolithically joined with a back panel during a knitting process in accordance with an embodiment.

FIG. 7 is a diagram showing various stages of an illustrative knitting process for forming a monolithic case of the type shown in FIG. 4. Knitting equipment of the type shown in FIG. 6 may be used to carry out the steps shown in FIG. 7.

The knitting process begins with forming peripheral wall portion 32. Peripheral wall 32 may be formed from rows of knitted loops (e.g., 10-12 rows of knitted loops, 10-15 rows of knitted loops, 5-15 rows of knitted loops, greater or less than 15 rows of knitted loops, or other suitable number of rows of knitted loops). Row 1 of peripheral wall 32 may be knitted first, then row 2, and so on, until finally row N is knitted. Row N corresponds to the final row of loops in peripheral wall portion 32. Row N of peripheral wall 32 will be joined with back panel 34 (e.g., at locations 72 of FIG. 4). Row 1 of peripheral wall portion 32 forms the upper edge of case 20 (e.g., the edge of portion 28 of FIG. 4, or the top edge of vertical portion 30 if portion 28 is omitted).

Following formation of peripheral wall 32 (e.g., after forming row N), the process of knitting back panel 34 begins by knitting row N+1, which is the first row of back panel 34. Following row N+1, row N+2 may be knitted, and so on, until finally row N+M is knitted. As each row of back panel 34 is knitted, the loops of top row N of peripheral wall 32 may be joined with the outer edge loops of back panel 34 (e.g., the loops at the opposing ends of each row of back panel 34). In particular, the loops of row N of left wall portion 32L may be joined with the loops along left edge 34L of back panel 34 at locations 40L. The loops of row N of right wall portion 32R may be joined with the loops along right edge 34R of back panel 34 at locations 40R. The loops of row N in locations 120 are closest to the first row of back panel 34 (row N+1) and are the first loops to be joined with back panel 34. The loops of row N in locations 44 are the last loops to be joined with back panel 34.

Arrows 46, 48, 50, 52, and 54 show how the location of peripheral wall 32 changes throughout the knitting process. Initially, peripheral wall 32 is knitted as a single elongated strip at location 46. The length of the elongated strip that forms peripheral wall 32 may be equal to the perimeter of back panel 34 (e.g., in arrangements where peripheral wall 32 wraps around the entire perimeter) or the length may be less than the perimeter of back panel 34 (e.g., in arrangements where peripheral wall 32 only extends partially around the perimeter of back panel 34). As the loops of row N are joined with subsequent rows of back panel 34, peripheral wall 32 is gradually pulled in towards edges 34L and 34R of back panel 34 (e.g., peripheral wall 32 is gradually pulled in direction 56 from location 46, to location 48, to location 50, to location 52, and finally to location 54 in which peripheral wall 32 is fully integrated with back panel 34).

When peripheral wall 32 is fully attached to back panel 34, the rows of loops that form peripheral wall 32 may have some portions that extend perpendicular to the rows of loops that form back panel 34 and some portions that extend parallel to the rows of loops that form back panel 34. For example, when peripheral wall 32 is in final location 54 and fully attached to back panel 34, the rows of loops that form back panel 34 may extend in direction 118. The rows of loops that form peripheral wall 32 may have first and second portions that extend in direction 116 (e.g., along the left and right sides of case 20) and third and fourth portions that extend in direction 118 (e.g., along the top and bottom sides of case 20.

The opposing ends 56 of peripheral wall strip 32 may be joined in any suitable fashion. Ends 56 may be joined to back panel 34 with seams or stitches, may be joined to each other, or may otherwise be integrated with back panel 34.

Figure 8:
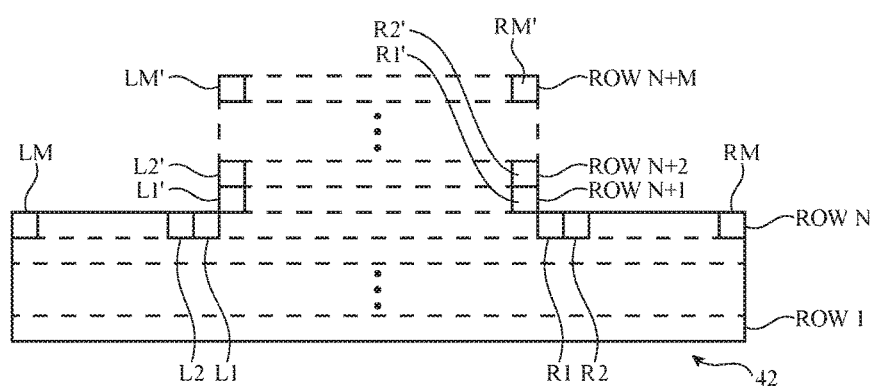
FIG. 8 is a diagram illustrating how loops of a peripheral wall portion may be joined with loops of a back panel portion during a knitting process in accordance with an embodiment.

FIG. 8 illustrates the order in which loops of peripheral wall 32 are joined with the loops of back panel 34. Following the formation of the N rows that make up peripheral wall 32, the knitting process of back panel 34 begins with row N+1. Row N+1 has left outer loop L1' and right outer loop R1'. Row N has left loop L1 and right loop R1. Initially, loop L1 is offset by one needle from loop L1'. Similarly, loop R1 is offset by one needle from loop R1'. Yarn positioning structures may be used to transfer loop L1 from its needle to the needle holding L1'. Loop R1 may be transferred from its needle to the needle holding R1'. Following these transfers, loop L1 and loop L1' will be held on the same needle, and loop R1 and loop R1' will be held on the same needle. This results in loop L1 and loop L1' being captured together on one edge of back panel 34 (e.g., left edge 34L) and loop R1 and R1' being captured together on the opposing edge of back panel 34 (e.g., right edge 34R) when row N+2 is formed. This process is then repeated for the next row of back panel 34. Loop L2 (e.g., one loop over from loop L1) is moved from its needle to the needle holding loop L2'. Loop R2 (e.g., one loop over from loop R1) is moved from its needle to the needle holding loop R2'. When the next row of loops in back panel 34 is formed, loop L2 and loop L2' will be captured together on the left edge of back panel 34 and loop R2 and R2' will be captured together on the right edge of back panel 34. When the last row of back panel 34 is knitted (e.g., row N+M), loop LM will be captured together with loop LM' on the left edge of back panel 34, and loop RM and RM' will be captured together on the right edge of back panel 34. After the last loops of peripheral wall 32 are joined with the edges of back panel 34, peripheral wall 32 will extend around the perimeter of back panel 34, thereby forming case 20.

Figure 9:
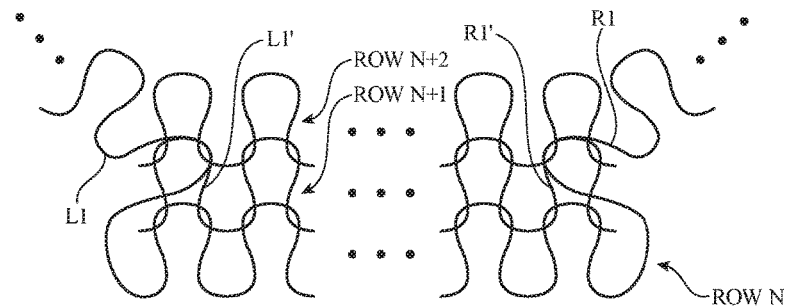
FIG. 9 is a diagram illustrating how peripheral wall loops and back panel loops may be collected on the same needle hook in accordance with an embodiment.

FIG. 9 is a diagram illustrating how left and right loops of peripheral wall 32 may be transferred to join loops of back panel 34 during the knitting process described in connection with FIGS. 7 and 8. As shown in FIG. 9, left loop L1 of row N is transferred to the needle holding left loop L1' of row N+1, and right loop R1 of row N is transferred to the needle holding right loop R1' of row N+1. When row N+2 is formed, loops L1 and L1' are captured together, and loops R1 and R1' are captured together.

Figure 10:
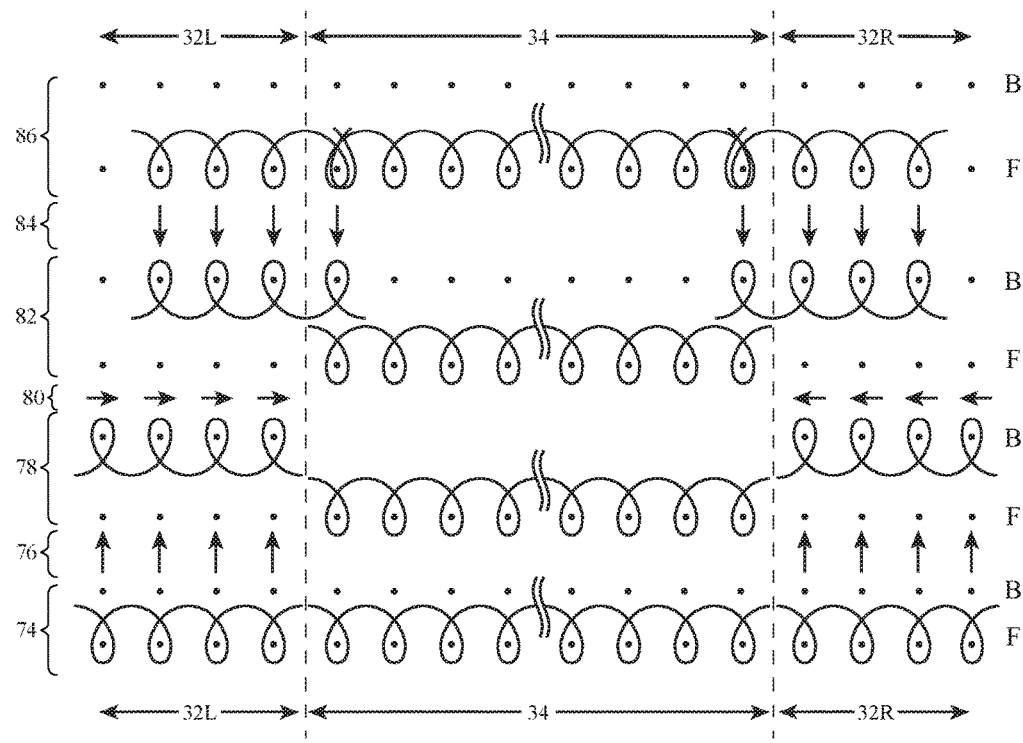
FIG. 10 is a point paper representation of an illustrative knitting pattern that may be used to produce a fabric case having a peripheral wall and a back panel that are monolithically joined in accordance with an embodiment.

FIG. 10 is a point paper representation of a knitting pattern that may be used to carry out the knitting process described in connection with FIGS. 7, 8, and 9. In this type of diagram, each dot represents one needle and each horizontal row of dots represents a row of needles (e.g., a needle bed). In the example of FIG. 10, there are two needle beds, a front bed (labeled F) and a back bed (labeled B). Each pair of rows of dots (one front row F and one back row B) represents a stitch forming process. When read from bottom to top, the diagram of FIG. 10 represents the succession of several stitch-forming processes, showing a complete repeat of the knitting cycle. The arrows between each pair of rows represent a direction of movement of loops between each step. For simplicity, the diagram of FIG. 10 does not show the knitting cycle that is used to form the first N rows of peripheral wall 32. Instead, the diagram of FIG. 10 shows the knitting cycle that is used to form back panel 34 and to join the loops of peripheral wall 32 to back panel 34, which begins after the first N rows of peripheral wall 32 are knitted.

Row 74 of FIG. 10 shows a first stitch forming process of the repeat fabric structure. Loops of left peripheral wall portion 32L, right peripheral wall portion 32R, and rear wall 34 are located on respective needles in front needle bed F.

Row 76 shows how the loops of left peripheral wall portion 32L and right peripheral wall portion 32R may be transferred from front needle bed F to back needle bed B. The loops of back panel 34 may remain on front needle bed F.

Row 78 shows the stitch-forming process following the loop movement of row 76. The loops of left wall portion 32L and right wall portion 32R are on back needle bed B, while the loops of back panel 34 are on front needle bed F.

Row 80 shows how the loops of left peripheral wall portion 32L may are each moved one needle to the right, while the loops of right peripheral wall portion 32R are each moved one needle to the left.

Row 82 shows the stitch-forming process following the loop movement of row 80. The loops of left wall portion 32L and right wall portion 32R remain on back needle bed B, and the loops of back panel 34 remain on front needle bed F. One loop on left peripheral wall portion 32L rests on a back needle directly opposite a front needle holding a left edge loop of back panel 34. One loop on right peripheral wall portion 32R rests on a back needle directly opposite a front needle holding a right edge loop of back panel 34.

Row 84 shows how the loops of left peripheral wall portion 32L and right peripheral wall portion 32R may be transferred from back needle bed B to back needle bed F. The loops of back panel 34 may remain on front needle bed F.

Row 86 shows the stitch-forming process following the movement of row 84. Loops of left peripheral wall portion 32L, right peripheral wall portion 32R, and rear wall 34 are located on front needle bed F. One loop on left peripheral wall portion 32L shares a front needle with a left edge loop of back panel 34. One loop on right peripheral wall portion 32R shares a front needle with a right edge loop of back panel 34. Each pair of loops that share a needle will be captured together when the next row of back panel 34 is knitted.

This process is repeated for each row of back panel 34 until back panel 34 is complete and peripheral wall 32 is fully attached to back panel 34 (e.g., until all of the loops of row N of peripheral wall 32 are joined with the outer edge loops of back panel 34).

Figure 11:
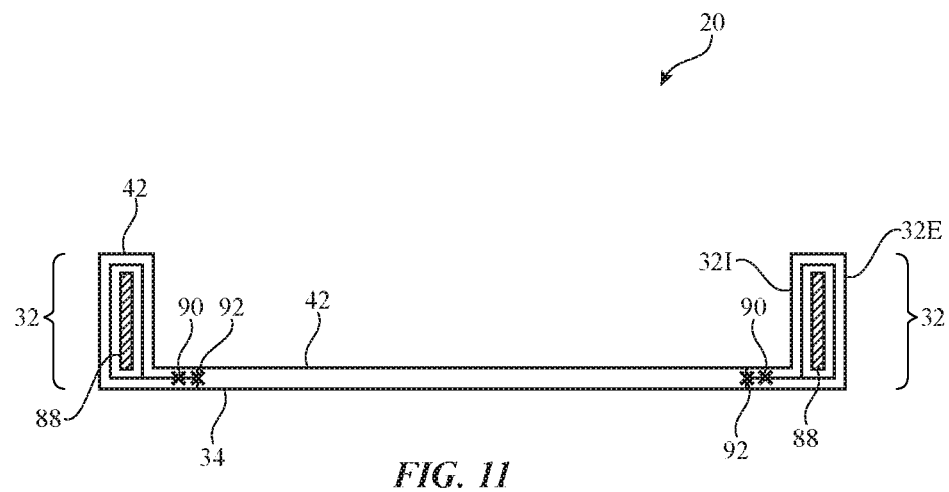
FIG. 11 is a cross-sectional side view of a removable case having a peripheral wall that encloses a stiffener in accordance with an embodiment.
Figure 12:
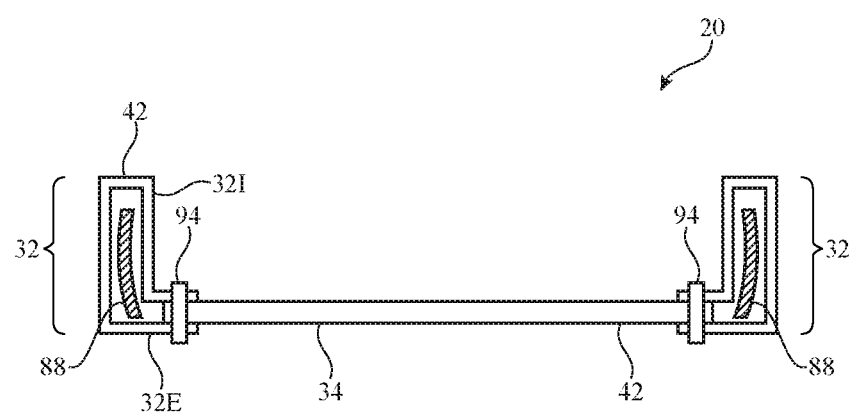
FIG. 12 is a cross-sectional side view of a removable case having a peripheral wall that encloses a stiffener and having unfinished ends that are captured by a stitch in accordance with an embodiment.

FIGS. 11 and 12 are cross-sectional side views of illustrative cases 20 of the type shown in FIG. 5. In this type of example, peripheral wall 32 and back panel 34 are formed separately and subsequently attached to one another. Because wall 32 and back panel 34 are formed separately, wall 32 and back panel 34 may have different fabric constructions, if desired. For example, peripheral wall 32 may be a flat knit single layer structure, a seamless tube of fabric, one or more strips of fabric that are joined to form a rectangular outline, a spacer fabric, or other suitable fabric type. Back panel 34 may be a flat knit structure, a warp knit structure, a weft knit structure, a spacer fabric, one or more strips of fabric that are joined to form a panel, or other suitable fabric type.

If desired, one or more stiffening structures may be incorporated into case 20 to provide structure, rigidity, and/or impact protection. As shown in FIG. 11, for example, peripheral wall 32 may enclose one or more stiffening structures such as stiffener 88. Stiffener 88 may be a single structure that extends continuously around the perimeter of device 10 when device 10 is placed within case 20, or stiffener 88 may be formed from multiple segments that extend partially or completely around the perimeter of device 10. Stiffener 88 may, for example, be located at the corners of case 20 (e.g., corners 20C of FIG. 3), may be located along one, two, three, or four sides of case 20, and/or may be located in back panel 34. Stiffener 88 may be a layer of plastic (e.g., polycarbonate, acrylonitrile butadiene styrene, or other suitable plastic), an additional fabric layer (e.g., a tightly woven or knitted fabric with some stiffness and rigidity), a layer of metal, ceramic, or other material, or other suitable stiffening layer. Stiffener 88 may be inserted after wall 32 is formed, may be inserted after wall 32 is attached to back panel 34, or may be inserted during the knitting process (or other yarn intertwining process) that is used to form wall 32.

In the example of FIG. 11, peripheral wall 32 is formed from a single layer of fabric 42 that has been folded over to create interior wall 32I and exterior wall 32E. Stiffener 88 may be interposed between interior wall 32I and exterior wall 32E. A seam such as seam 90 may be used to attach the bottom portion of interior wall 32I to the bottom portion of exterior wall 32E. Seam 90 may, for example, include a chain stitch (e.g., a monofilament or multifilament chain stitch). If desired, a second seam such as seam 92 may be used to join peripheral wall 32 with back panel 34.

FIG. 12 shows an arrangement similar to that of FIG. 11, except that a single seam such as seam 94 may be used to capture interior wall 32I, exterior wall 32E, and rear panel 34 together. Seam 94 may be a chain stitch or other suitable type of stitch.

FIG. 12 also shows how stiffener 88 may be curved or may have one or more curved portions. Stiffener 88 may, for example, have a side profile that matches the side profile of device 10. Stiffener 88 may extend behind device 10 when device 10 is in case 20, or stiffener 88 may only be located on the sides of device 10 when device 10 is in case 20.

Figure 13:
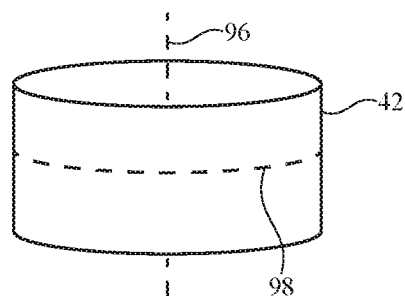
FIG. 13 is a perspective view of a seamless knit fabric that may be used to form peripheral walls of a case of the type shown in FIG. 5 in accordance with an embodiment.
Figure 14:
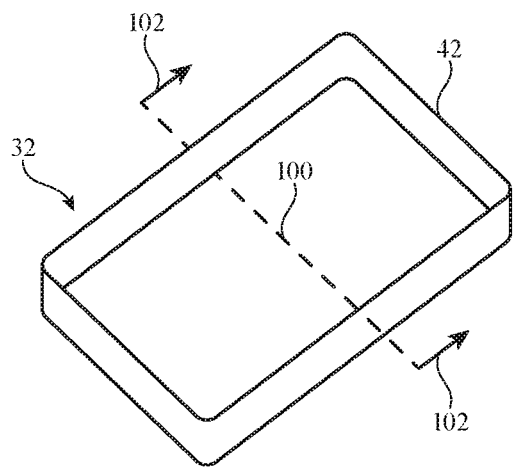
FIG. 14 is a perspective view of the seamless knit fabric of FIG. 13 after the fabric has been folded and shaped to form peripheral walls in accordance with an embodiment.
Figure 15:
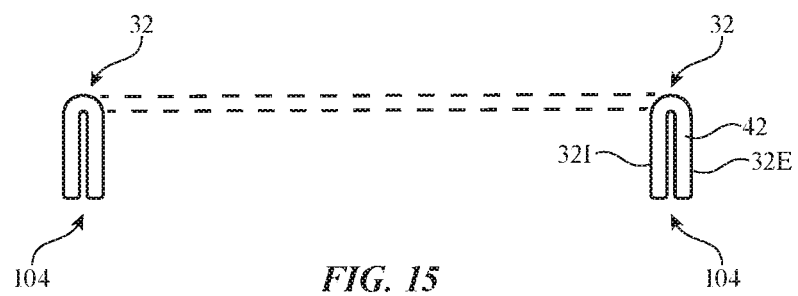
FIG. 15 is a cross-sectional side view of the peripheral wall fabric of FIG. 13 in accordance with an embodiment.

Peripheral wall 32 may, if desired, be formed from a seamless tube of fabric. FIGS. 13, 14, and 15 show how a seamless tube of fabric may be used to form peripheral wall 32. As shown in FIG. 13, fabric 42 may a continuous loop of fabric. Rather than being constructed as a flat layer with two edges that are later joined, fabric 42 may be constructed (e.g., knitted) in the form of a tube, in which the strands that make up fabric 42 extend continuously around longitudinal axis 96, with no edges or seams observable by a viewer. Fabric 42 may, for example, be a flat knit, single-layer tube.

In some arrangements, fabric 42 may be left as shown in FIG. 13 (e.g., unfolded) and attached to back panel 34 to form a single-layer, seamless wall 32. In other arrangements fabric 42 may be folded to provide wall 32 with multiple layers. For example, fabric 42 may be folded along midline 98 to form an interior layer 32I and exterior layer 32E of FIGS. 11 and 12.

FIG. 14 shows a perspective view of fabric 42 of FIG. 13 after fabric 42 is folded along line 98 and shaped into the desired shape (e.g., a rectangular shape matching the outline of device 10 or other suitable shape).

FIG. 15 shows a cross-sectional side view of fabric 42 of FIG. 14 taken along line 100 and viewed in direction 102. As shown in FIG. 15, fabric 42 may be folded along its midline to produce interior wall 32I and exterior wall 32E. If desired, a stiffener or other structure may be placed in gap 104 between interior wall 32I and exterior wall 32E. Peripheral wall 32 may then be attached to back panel 34.

Figure 16:
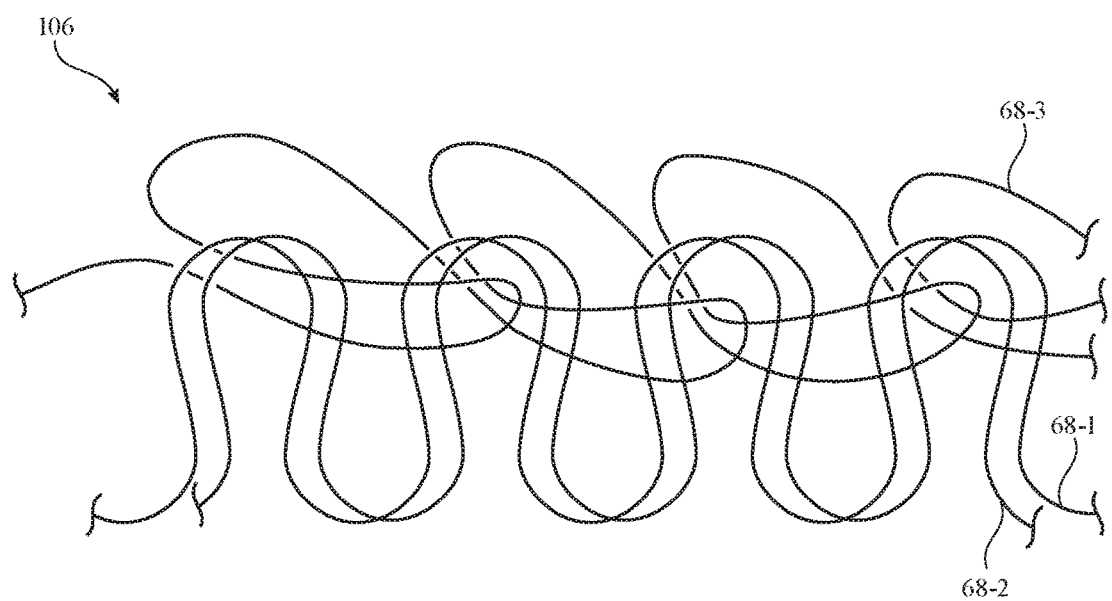
FIG. 16 is a side view of two fabric portions joined by a chain stitch in accordance with an embodiment.

FIG. 16 shows an illustrative chain stitch 106 that may be used to attach portions of fabric 42 of case 20 together. This type of chain stitch may, for example, be used to attach wall 32 to back panel 34 (e.g., at seam 92 of FIG. 11), to attach interior wall 32I to exterior wall 32E (e.g., at seam 90 of FIG. 11), and/or to attach interior wall 32I, exterior wall 32E, and back panel 34 together (e.g., at seam 94 of FIG. 12).

As shown in FIG. 16, yarns 68-1 and 68-2 may be joined using chain stitch yarn 68-3. Yarn 68-1 may be part of a first fabric portion (e.g., wall 32) and yarn 68-2 may be part of a second fabric portion (e.g., back panel 34). Chain stitch yarn 68-3 may be a monofilament or multi-filament strand that forms a series of loops. Each loop of yarn 68-3 may pass through a loop in yarn 68-1 and a loop in yarn 68-2. Each loop of yarn 68-3 may be threaded through a preceding loop in yarn 68-3 to hold the stitches in place. This type of chain stitch is sometimes referred to as linking and may be formed using a dial linking machine, if desired.

Figure 17:
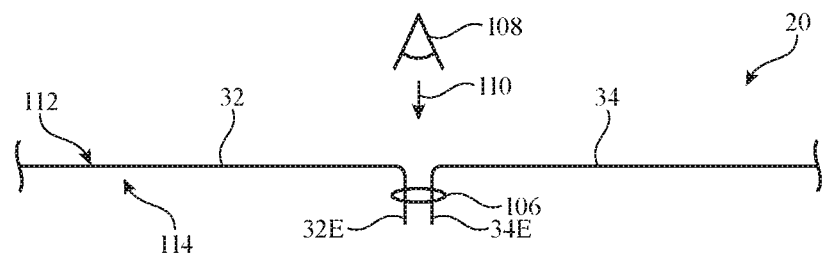
FIG. 17 is a side view of two joined fabric portions of a case in which both fabric edges face the interior of the case in accordance with an embodiment.
Figure 18:
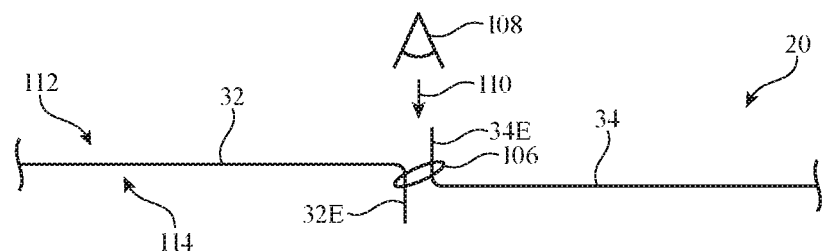
FIG. 18 is a side view of two joined fabric portions of a case in which one fabric edge faces the interior of the case and the other fabric edge faces the exterior of the case in accordance with an embodiment.
Figure 19:
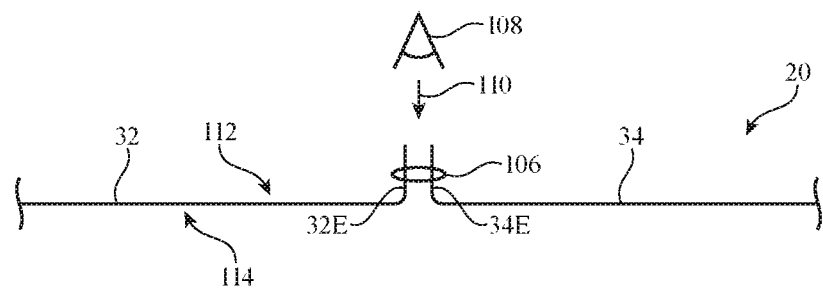
FIG. 19 is a side view of two joined fabric portions of a case in which both fabric edges face the exterior of the case in accordance with an embodiment.

FIGS. 17, 18, and 19 show how the edges of the fabric portions that are joined by chain stitch 106 may protrude slightly from chain stitch 106. In some arrangements, it may be desirable to hide the protruding edges of fabric from view. In other arrangements, these fabric edges can be made visible and can become part of the overall look and feel of case 20.

FIG. 17 shows how both end 34E of back panel 34 and end 32E of peripheral wall 32 may face interior 114 of case 20, so that a viewer such as viewer 108 viewing case 20 in direction 110 does not see ends 34E and 32E on exterior side 112 of case 20.

In the example of FIG. 18, end 34E of back panel 34 faces exterior 112 of case 20, while end 32E of peripheral wall 32 faces interior 114 of case 20. Viewer 108 viewing case 20 in direction 110 may be able to see end 34E of back panel 34 on the exterior side 112 of case 20. If desired, the arrangement of FIG. 18 may be switched such that end 32E of peripheral wall 32 faces exterior 112 and end 34E of back panel 34 faces interior 114.

In the example of FIG. 19, both end 34E of back panel 34 and end 32E of peripheral wall 32 face exterior side 112 of case 20 such that both ends are visible to viewer 108 viewing case 20 in direction 110.

The foregoing is merely illustrative and various modifications can be made by those skilled in the art without departing from the scope and spirit of the described embodiments. The foregoing embodiments may be implemented individually or in any combination.

What is claimed is:
1. A fabric case for an electronic device, comprising:
a knit back panel having a periphery; and a knit peripheral wall that extends around the periphery of the knit back panel, wherein the knit back panel and the knit peripheral wall are monolithically joined.

2. The fabric case defined in claim 1 wherein the knit peripheral wall comprises a first row of loops, wherein the knit back panel comprises a second row of loops, and wherein the first row has a portion that extends perpendicular to the second row.

3. The fabric case defined in claim 2 wherein the first row has an additional portion that extends parallel to the second row.

4. The fabric case defined in claim 2 wherein the first row of loops comprises a first left loop and a first right loop, wherein the second row or loops comprises a second left loop and a second right loop, wherein the first left loop and second left loop are captured together on a left edge of the knit back panel, and wherein the first right loop and second right loop are captured together on a right side of the knit back panel.

5. The fabric case defined in claim 4 wherein the knit back panel comprises a third row of loops including a third left loop and a third right loop, wherein the first left loop and second left loop are captured by a third left loop in the third row of loops, and wherein the first right loop and the second right loop are captured by a third right loop in the third row of loops.

6. The fabric case defined in claim 1 wherein the knit peripheral wall comprises a first plurality of rows of loops, wherein the knit back panel comprises a second plurality of rows of loops, and wherein each loop in a top row of the first plurality of rows of loops is joined with an associated loop in the second plurality of rows loops.

7. The fabric case defined in claim 6 wherein each row in the first plurality of rows extends around the periphery of the knit back panel.

8. The fabric case defined in claim 1 wherein the knit peripheral wall extends perpendicular to the knit back panel.

9. A case for an electronic device, comprising:
  a fabric panel having a periphery;
  a fabric sidewall that extends around the periphery, wherein the fabric sidewall comprises an exterior layer and an interior layer; and
  a stiffener interposed between the interior layer and the exterior layer.

10. The case defined in claim 9 further comprising a chain stitch that joins the fabric panel and the fabric sidewall.

11. The case defined in claim 10 wherein the interior layer and the exterior layer of the fabric sidewall are captured in the chain stitch.

12. The case defined in claim 10 wherein the fabric case has interior and exterior surfaces, wherein the fabric panel has a first end that is captured by the chain stitch and the fabric sidewall has a second end that is captured by the chain stitch, and wherein the first and second ends are located on the exterior surface of the fabric case.

13. The case defined in claim 10 wherein the fabric case has interior and exterior surfaces, wherein the fabric panel has a first end that is captured by the chain stitch and the fabric sidewall has a second end that is captured by the chain stitch, and wherein the first and second ends are located on the interior surface of the fabric case.

14. The case defined in claim 10 wherein the fabric case has interior and exterior surfaces, wherein the fabric panel has a first end that is captured by the chain stitch and the fabric sidewall has a second end that is captured by the chain stitch, and wherein only one of the first and second ends is located on the exterior surface of the fabric case.

15. The case defined in claim 9 wherein the stiffener comprises plastic.

16. The case defined in claim 9 wherein the fabric sidewall comprises a seamless tube of fabric that extends continuously around the periphery of the fabric panel.

17. The case defined in claim 16 wherein the seamless tube of fabric is folded.

18. A method for forming a fabric case for an electronic device, comprising:
  knitting a peripheral sidewall;
  knitting a back panel; and
  while knitting the back panel, attaching the peripheral sidewall to the back panel.

19. The method defined in claim 18 wherein the peripheral sidewall comprises a first loop held by a first needle and the back panel comprises a second loop held by a second needle, and wherein attaching the peripheral sidewall to the back panel comprises transferring the first loop from the first needle to the second needle.

20. The method defined in claim 19 wherein knitting the back panel comprises knitting a row of loops, wherein the row of loops captures the first and second loops together.

* * * * *